(12) United States Patent
Crolly et al.

(10) Patent No.: US 7,710,113 B2
(45) Date of Patent: *May 4, 2010

(54) MAGNETIC SENSOR WITH OFFSET MAGNETIC FIELD

(75) Inventors: Guenther Crolly, Goellheim (DE); Thorsten Muehge, Budenheim (DE); Rolf Schaefer, Mainr (DE); Ernst-Dieter Weissenberger, Ober-Hilbersheim (DE)

(73) Assignee: International Business Machines Corporation, Armonk, NY (US)

( * ) Notice: Subject to any disclaimer, the term of this patent is extended or adjusted under 35 U.S.C. 154(b) by 19 days.

This patent is subject to a terminal disclaimer.

(21) Appl. No.: 11/738,484

(22) Filed: Apr. 21, 2007

(65) Prior Publication Data
US 2008/0054897 A1 Mar. 6, 2008

Related U.S. Application Data

(63) Continuation of application No. 11/256,324, filed on Oct. 21, 2005.

(30) Foreign Application Priority Data
Oct. 21, 2004 (EP) .................................. 04105207

(51) Int. Cl.
*G01R 33/02* (2006.01)
*G01B 7/14* (2006.01)

(52) U.S. Cl. .................................. 324/252; 324/207.21
(58) Field of Classification Search ............ 324/207.21, 324/207.24, 207.25, 252; 338/32 R, 32 H
See application file for complete search history.

(56) References Cited

U.S. PATENT DOCUMENTS

| | | | | |
|---|---|---|---|---|
| 5,255,442 | A | * 10/1993 | Schierbeek et al. | ........... 33/361 |
| 6,373,247 | B1 | * 4/2002 | Marx et al. | ............... 324/252 |
| 2006/0087318 | A1 | * 4/2006 | Crolly et al. | ............... 324/252 |

* cited by examiner

*Primary Examiner*—Reena Aurora
(74) *Attorney, Agent, or Firm*—Jennifer Anda

(57) ABSTRACT

A method, a magnetic field sensor, and an electronic device measure and determine the magnitude and/or the direction of a magnetic field. The magnetic sensor is based on at least a first magnetoresistive-layered structure having an electric resistance depending on the magnitude of the magnetic field. The magnetic sensor generates at least a first offset magnetic field. The magnitude and the direction of the offset magnetic field can be modified to compensate the magnetic field. The electric resistance of the magnetoresistive-layered structure depends on the superposition of magnetic field and offset magnetic field. A maximum electric resistance indicates that the magnetic field is compensated by the offset magnetic field. In this case the magnitude of the magnetic field corresponds to the magnitude of the offset magnetic field, and the direction of the magnetic field is given by the reversed direction of the offset magnetic field.

10 Claims, 10 Drawing Sheets

MAGNETIC SENSOR WITH OFFSET MAGNETIC FIELD

RELATED PATENT APPLICATIONS

The present patent application is a continuation of the pending US patent application entitled "Magnetic sensor with offset magnetic field," filed on Oct. 21, 2005, and assigned Ser. No. 11/256,324, which claims priority to and the benefit of, under 35 USC 119, the European Patent Office patent application entitled "Magnetic sensor with offset magnetic field," filed on Oct. 21, 2004, and assigned application no. 04105207.7.

FIELD OF THE INVENTION

The present invention relates generally to magnetic sensors, and more particularly to such magnetic sensors that use the magnetoresistive effect.

BACKGROUND OF THE INVENTION

Magnetoresistive elements feature an electrical resistance that strongly depends on the magnitude and/or direction of an externally applied magnetic field. Generally, there exist a large variety of different magnetoresistive elements making use of different fundamental effects. For example, the Anistropic Magnetoresistive (AMR) effect shows a change in electrical resistance in the presence of a magnetic field. AMR sensors are typically made of a soft-magnetic material, such as nickel-iron (Permalloy) thin film deposited on a silicon wafer. The magnetoresistive effect is dependent mainly on the relative direction between an electrical current and the direction of magnetization.

Another effect is the oscillatory exchange interaction of ferromagnetic layers depending on the thickness of the normal metal spacer layer and the giant magneto resistance (GMR) in the exchange-coupled multilayers. The latter effect is driven by the relative magnetic orientation of the adjacent ferromagnetic layers. Replacing the non-magnetic layers by an insulator eliminates the exchange. However, by pinning the first ferromagnetic layer with an anti-ferromagnetic layer an anti-parallel oriented stack can be caused by an external magnetic field. Applying the electric current perpendicular through the ferromagnetic-insulating ferromagnetic stack results in a large change of the tunnel magneto resistance (TMR).

In general, the magnitude and/or direction of the magnetic field can be measured by using at least one magnetoresistive element. However, using only one element makes the device rather sensitive to externally driven drifts, such as temperature and hysteresis drifts. In order to avoid this problem, relative measurements, being sensitive just to external magnetic changes, can be performed. This can be realized, for example, in a Wheatstone bridge arrangement. At least four elements of identical resistance are required. Two adjacent pairs of elements typically exhibit different magnetoresistive behaviors. In such a design, the measured signal is proportional to the relative changes of the magneto resistance of adjacent resistance pairs.

Moreover, when implemented in combination with elements made of soft magnetic material, such as Permalloy, various components of the externally applied magnetic field can be effectively separated and separately detected, thus allowing for a determination of the direction of the magnetic field. Hence, a Wheatstone bridge arrangement serves as a universal tool to generate an electrical signal that depends on the magnitude and/or the direction of an externally applied magnetic field.

In typical implementations, such a Wheatstone bridge features an offset drift that might be caused by slight deviations of the electrical and/or magnetic properties of its components. Even magnetoresistive elements of the same type series might be subject to inevitable production tolerances. Consequently, a bridge circuit may provide a non-zero output voltage even in the absence of a magnetic field. This offset of a bridge circuit is in particular rather disadvantageous, when magnetic fields of low magnitude have to be measured, such as the earth magnetic field. In such cases the offset of a Wheatstone bridge might be in the same range as the signal that has to be measured.

Offset drift elimination can, for example, be performed by a so-called flipping procedure when AMR elements are implemented in the bridge circuit. A short magnetic pulse can be applied to the sensor element in order to reverse its sensitivity. Making use of periodically alternated flipping pulses and a lock-in amplifier, the resulting output of the bridge becomes independent of sensor and amplifier offset. This flipping procedure is only applicable to AMR elements that generally feature a limited magnetic sensitivity, and a rather large size and a relatively low electric resistance that leads to fairly high power consumption in operation mode.

In contrast to AMR elements, GMR elements feature a significantly higher magnetic sensitivity, and they are smaller in size and have a higher electrical resistance. However, the flipping procedure for offset compensation cannot be applied to GMR elements, because GMR elements do not inherently allow a reversal of their sensitivity. GMR multilayer elements feature another disadvantage in form of being insensitive to the direction of a magnetic field. Directional magnetic field sensors can therefore be implemented by making use of AMR elements or GMR spin valves that feature a spatially fixed ferromagnetic layer and a free layer, whose magnetization is free to follow an external magnetic field. In general, spin valves may be permanently destroyed by high magnetic field or current pulses. Additionally, such structures are also more sensitive to high temperatures than multilayers. Moreover, GMR spin valves require additional production processes as compared to standard, non-pinned GMR elements.

In principle, a directional sensor can be implemented on the basis of GMR multilayer elements in combination with flux guides providing spatial decomposition components of a magnetic field. Furthermore, in principle, determination of a direction of a magnetic field is possible with the above-mentioned magnetoresistive elements and configurations. However, all these approaches may suffer from temperature drift, mechanical stress or hysteresis of the magnetoresistive elements.

Even though AMR and GMR spin valve elements provide an electric resistance that depends on the direction of an external magnetic field, these elements inherently do not provide an unequivocal determination of the direction of the magnetic field. Typically, the electric resistance of those magnetoresistive elements inherently features a periodicity of 90°. An unequivocal determination of the direction of the magnetic field over a range from zero to 360° is rather sophisticated and requires, for example, an implementation of a plurality of bridge circuits.

Therefore, there is a need in the prior art for an improved offset compensation for bridge circuits that makes use of magnetoresistive elements and that provides an improved direction determination of a magnetic field. For these and other reasons, there is a need for the present invention.

SUMMARY OF THE INVENTION

The present invention provides a magnetic field sensor for measuring an external magnetic field. The inventive magnetic field sensor includes means, or a mechanism, for generating an at least first offset magnetic field and further includes at least a first magnetoresistive-layered structure that has an electrical resistance depending on the magnitude of a first magnetic field. This first magnetic field includes components of the external magnetic field and components of the offset magnetic field.

The at least first magnetoresistive-layered structure of the magnetic field sensor is adapted to sense a superimposed magnetic field. This superimposed magnetic field has a contribution from the external magnetic field and from the at least first offset magnetic field that is generated by the magnetic field sensor itself. The offset magnetic field is either constant or can be arbitrarily modified. In any case, the magnitude and/or direction of the offset magnetic field is known.

Hence, the offset magnetic field can be used for calibration or/and applying an appropriate measurement procedure. Measuring the electric resistance of the at least first magnetoresistive-layered structure is indicative of the superimposed magnetic fields. Since magnitude and/or direction of the offset magnetic field are known, magnitude and direction of the external field can be derived from the measured electrical resistance of the magnetoresistive-layered structure. Thus, the magnitude of the external magnetic field can be precisely determined irrespective of any inherent offset or intrinsic deviation of the magnetic or electrical properties of the at least first magnetoresistive-layered structure.

According to one embodiment of the invention, the means, or the mechanism, for generating the at least first offset magnetic field further include first means and second means, or a first mechanism and a second mechanism, for generating a first and a second modifiable component of the at least first offset magnetic field, respectively. The first modifiable component of the at least first offset magnetic field has a first direction and the second modifiable component of the at least first offset magnetic field has a second direction.

The first and second directions of the respective first and second modifiable components of the offset magnetic field are neither parallel nor anti-parallel with respect to each other. These first and second directions can be perpendicular. In this way the at least first offset magnetic field can be generated in a plane specified by the first and second directions, with arbitrary magnitude and arbitrary orientation in the given plane. In three-dimensional space, the first direction may, for example, refer to the x-direction and the second direction may refer to the z-direction. By separately generating x- and z-components of the at least first offset magnetic field, the resulting offset magnetic field may feature an arbitrary direction within the x-z plane.

Making use of, for example, a GMR element as the at least first magnetoresistive-layered structure allows the electric resistance that can be measured to become maximal when the absolute value of the magnetic field, such as the superimposed magnetic field, in the vicinity of the at least first magnetoresistive-layered structure is minimal. By measuring of the GMR element's electric resistance while simultaneously modifying the first component of the at least first offset magnetic field, a maximum of the electric resistance can be measured for a first value of the first modifiable component of the at least first offset magnetic field. This first value of the first modifiable component of the at least first offset magnetic field is substantially equal in magnitude to the corresponding component of the external magnetic field. Hence, the maximum of the electric resistance arises when the first modifiable component of the at least first offset magnetic field exactly compensates the corresponding component of the external magnetic field.

After determination of this first value, a corresponding procedure can be performed with the second modifiable component of the at least first offset magnetic field. By sequentially modifying first and second components of the at least first offset magnetic field, a first and second maximum electric resistance of the at least first magnetoresistive-layered structure can be precisely determined. The first and second values of the first and second modifiable components of the at least first offset magnetic field that correspond to the first and second maximum electric resistance serve to compensate the external magnetic field in the vicinity of the magnetoresistive-layered structure.

It can be assumed that the external magnetic field features a first x-component and a second z-component. By modifying the magnitude of the first modifiable component of the at least first offset magnetic field that points in the x-direction, a maximum electric resistance of the first magnetoresistive-layered structure can be determined. When the electric resistance is maximal it can be assumed that the x-component of the offset magnetic field exactly compensates the x-component of the external magnetic field. In the same way, the z-component of the at least first offset magnetic field can be modified in order to find a corresponding maximum electric resistance of the at least first magnetoresistive-layered structure.

This second maximum electric resistance then determines, or controls, the magnitude of the z-component of the at least first offset magnetic field that serves to compensate the z-component of the external magnetic field. In this way a directional magnetic field sensor can be implemented by making use of a single GMR element. The first and second means, or mechanisms, for generating respective first and second modifiable components of the at least first offset magnetic field must provide generation of respective first and second modifiable components in the vicinity of the at least first magnetoresistive-layered structure.

In this way, it can be effectively guaranteed that the first and second modifiable components of the at least first offset magnetic field have the same impact on the electric resistance of the at least first magnetoresistive-layered structure as the corresponding components of the external magnetic field. The first and second means, or mechanisms, can effectively provide generation of first and second components in respective first and second directions as well as in opposite directions. For example, the first modifiable component may point either in x-direction or in the opposite x-direction. The first and second means, or mechanisms, for generating the corresponding first and second modifiable components can be electrically controllable, such that the magnitude of the first and second modifiable magnetic field components can be controlled by electrical signals.

According to another embodiment of the invention, the means, or mechanisms, for generating the at least first offset magnetic field are further adapted to generate an at least second offset magnetic field. This second offset magnetic field is substantially anti-parallel to the at least first offset magnetic field and features a substantially equal magnitude than the at least first offset magnetic field. Hence, the means, or mechanisms, for generating the at least first offset magnetic field further provides for reversing the generated offset magnetic field as an at least second offset magnetic field. In principle, reversal of the at least first offset magnetic field can be generated by the above-mentioned first and second means, or mechanisms, for generating of first and second modifiable components of the at least first offset magnetic field.

Generating the at least first offset magnetic field provides a first superimposed magnetic field that can be measured by the at least first magnetoresistive-layered structure. Correspondingly, generation of the reversed second offset magnetic field provides a second superimposed magnetic field that can be subsequently measured. By measuring these first and second superimposed magnetic fields by the at least first magnetoresistive-layered structure, an inherent magnetic or electrical offset of the at least first magnetoresistive-layered structure and an intrinsic falsification can be effectively eliminated. Generation of the at least first and second offset magnetic fields is particularly applicable in a bridge circuit making use of at least two magnetoresistive-layered structures.

According to another embodiment of the invention, the means, or mechanisms, for generating of the at least first and/or second offset magnetic fields are implemented on the basis of a permanent magnetic element and/or a ferromagnetic element and/or an inductive element and/or an electrically conductive element. When implemented on the basis of a permanent or a ferromagnetic element featuring a permanent magnetization, the means, or mechanisms, for generating of the at least first offset magnetic field provide an offset magnetic field of constant magnitude. The direction is governed by the production process. By implementing the means, or mechanisms, for generating of the at least first and/or second offset magnetic fields and their respective first and second components on the basis of inductive elements and/or electrically conductive elements, the magnitude and/or the direction of the at least first and second offset magnetic fields can be effectively controlled by electrical signals.

For example, the first means, or mechanism, for generating of the first modifiable offset magnetic field component can be implemented by making use of an electrically conductive wire providing a flow of a current that produces a magnetic field in radial direction with respect to the elongated axis of the wire. Arranging a straight wire along the z-direction, a current flowing through that wire may produce a magnetic field in the x-y-plane. By appropriately positioning the at least first magnetoresistive-layered structure and the wire, a current flowing through the wire in z-direction may produce an x-component of the at least first offset magnetic field. By reversing the flow of the current through the wire, the corresponding magnetic field will also reverse and may therefore point in the opposite x-direction.

The magnitude of the current flowing through the wire further determines the magnitude of the component of the at least first offset magnetic field. In a similar way, the means, or mechanism, for generating the at least first offset magnetic field can be implemented on the basis of an inductive element, such as a coil. Furthermore, the strength of the electric current determines the magnitude of the evolving magnetic offset field and by application of an oppositely directed current, the offset magnetic field can be reversed. In particular, by making use of inductive and/or electrically conductive elements, such as coils and wires, the at least first offset magnetic field can be arbitrarily modified by making use of electrical signals in the form of electrical currents.

According to another embodiment of the invention, the means, or mechanisms, for generating of the at least first and/or second offset magnetic fields further includes a soft magnetic element that is arranged in the vicinity of the at least first magnetoresistive-layered structure. Soft-magnetic materials are those with a magnetic permeability significantly higher than that of free space. Typically, soft-magnetic materials cannot be permanently magnetized to a significant degree. These properties allow soft-magnetic materials to conduct magnetic flux in much the same way as copper wires are used to conduct electric currents. Common examples of soft-magnetic materials are pure iron and nickel-iron steels such as Permalloy, FeAlN, CoFe, and CoZrTa.

This soft-magnetic element is adapted to enhance the magnetic field that is induced by an electric current flowing through the at least first magnetoresistive-layered structure. In this way, the magnetic field that is inevitably generated by a current flowing through the at least first magnetoresistive-layered structure serves to magnetize the soft magnetic element. The magnetization of the soft magnetic element can be saturated and the corresponding demagnetization field of the soft magnetic material serves to enhance the magnetic field generated by the electric current that flows through the at least first magnetoresistive-layered structure. The current flowing through the at least first magnetoresistive-layered structure has to exceed a predefined threshold for which the soft magnetic element's magnetization is saturated. In this way, a constant offset magnetic field is generated in the vicinity of the at least first magnetoresistive-layered structure. The magnitude of the magnetic field created by the soft magnetic layer is determined by the saturation field of the soft magnetic element. The direction of the magnetic field created by the soft magnetic elements is determined by the direction of the current through the magnetic sensitive layer.

Hence, the invention is also applicable if the offset magnetic field does not compensate the external field. In this case the offset magnetic field can be created by a hard magnetic structure with permanent magnetization of by a soft magnetic structure that is magnetized by the current through the magnetoresistive-layered structure.

According to another embodiment of the invention, the magnetic field sensor further includes at least a second magnetoresistive-layered structure. The at least first and second magnetoresistive-layered structures are arranged in a first bridge circuit and exhibit a magnetoresistive effect, such as a Giant Magnetoresistive (GMR) effect. The bridge circuit can be implemented as a Wheatstone bridge and the at least first and second magnetoresistive-layered structures can be implemented as GMR elements of the same type. They can be arranged in an opposite way within the bridge circuit. Since a Wheatstone bridge typically features at least four resistive elements, the remaining two resistive elements might be implemented on the basis of resistors being insensitive to an applied magnetic field. Alternatively, the four resistors of the bridge circuit may all be implemented as GMR elements of the same type series, two of which are shielded from the external magnetic field.

According to another embodiment of the invention, the magnitude of the at least first offset magnetic field is substantially larger than the magnitude of the external magnetic field. In this way, a first and a second superimposed magnetic field can point in opposite directions, provided that the first and the second superimposed magnetic fields evolve from a superposition of the external magnetic field and the first and second offset magnetic fields, where the second offset magnetic field substantially equals the reversed first offset magnetic field.

In particular, by making use of a bridge circuit, such as a Wheatstone bridge, the output signal is substantially linear with the magnitude of the superimposed magnetic field applied at the at least first and second magnetoresistive-layered structures. Moreover, the output voltage signal is symmetric with respect to a positive and negative superimposed magnetic field. By superimposing the first offset magnetic field and the external magnetic field a first voltage signal can be obtained from the bridge circuit being indicative of the first superimposed magnetic field and by reversing the first offset magnetic field, and a second voltage output of the bridge circuit can be obtained that is indicative of the second superimposed magnetic field.

When the magnitude of the at least first offset magnetic field, and also of the at least second offset magnetic field, is substantially larger than the magnitude of the external magnetic field, the first and second superimposed magnetic fields refer to a rising and falling edge of the characteristic voltage diagram of the bridge circuit. The corresponding first and second voltage signals can then be mutually subtracted resulting in a voltage signal that is independent of the offset magnetic field as well as any drift offset of the bridge circuit.

According to another embodiment of the invention, the at least first offset magnetic field has a substantial equal impact on the at least first and second magnetoresistive-layered structures. Furthermore, the at least second offset magnetic field has a substantial reverse impact on the at least first and second magnetoresistive-layered structures. Hence, in this embodiment the at least first offset magnetic field has an equal impact on all magnetoresistive-layered structures of the inventive magnetic field sensor. Therefore, the at least first offset magnetic field as well as the at least second offset magnetic field being the reverse first offset magnetic field have a global impact on the magnetoresistive-layered structures. Any generated offset magnetic field modifies the response of any magnetoresistive-layered structure of the magnetic field sensor in the same way.

According to another embodiment of the invention, the at least first offset magnetic field has a first impact on the at least first magnetoresistive-layered structure and the at least second offset magnetic field has a second impact on the at least second magnetoresistive-layered structure. In this embodiment, the at least first and second offset magnetic fields do not act in a global way but just have a local impact on different magnetoresistive-layered structures of the magnetic field sensor. Hence, an offset magnetic field can be separately generated for each one of the at least first and second magnetoresistive-layered structures. For example, when implemented in a bridge circuit, by selectively providing a first offset magnetic field to only a first magnetoresistive-layered structure, the balance of the bridge circuit can be shifted, thus allowing for a calibration of the bridge circuit in the absence and/or presence of an external magnetic field.

According to another embodiment of the invention, the magnetic field sensor further includes at least a third and a fourth magnetoresistive-layered structure. The at least first, second, third and fourth magnetoresistive-layered structures are arranged in the first bridge circuit. Additionally, the at least third and fourth magnetoresistive-layered structures include a soft magnetic element that is adapted to screen the external and/or offset magnetic field. In this way, only the first and the second magnetoresistive-layered structures of the bridge circuit provide an electric resistance depending on the magnitude and/or direction of the external magnetic field.

The at least first and second magnetoresistive-layered structures can be arranged in a diagonal way within the bridge circuit. The soft magnetic elements that are either attached to the at least third and fourth magnetoresistive-layered structure or that are at least arranged in close proximity to the at least third and fourth magnetoresistive-layered structures serve as magnetic shields. In this way, the third and fourth magnetoresistive-layered structures are substantially insensitive to the external and/or offset magnetic fields. The first, second, third and fourth magnetoresistive-layered structures can be of the same type series and feature a substantially equal electrical resistance. In this way, the four resistive elements of the bridge circuit can be implemented by substantially equal parts, thus inherently providing a balance of the bridge circuit when no external magnetic field is applied.

According to another embodiment of the invention, the magnetic field sensor further includes at least a first and a second soft magnetic planar structure that is separated by at least a first elongated gap. The at least first magnetoresistive-layered structure is then positioned along the at least first elongated gap. The at least first and second soft magnetic planar structures serve as flux guides that provide spatial decomposition of the externally applied magnetic field into its spatial components that are perpendicular to the elongation of the at least first gap.

For example, by closely spacing the at least first and second soft magnetic planar structure in the x-direction, the magnetic field lines in the evolving gap represent the x-component of the external magnetic field. In this way, the at least first magnetoresistive-layered structure serves to measure the strength of a spatial component of the externally applied magnetic field. By making use of a plurality of soft magnetic planar structures forming a first and a second elongated gap along substantially perpendicular directions, a magnitude of perpendicular components of the external magnetic field can be separately determined by the at least first and second magnetoresistive-layered structure.

Four magnetoresistive-layered structures can be arranged in four elongated gaps, two of which being parallel and two of which being perpendicular with respect to each other. Electrically connecting corresponding first, second, third and fourth magnetoresistive-layered structures in a bridge circuit, a directional magnetic field sensor can be effectively implemented. In particular, by making use of the at least first offset magnetic field, a symmetric output voltage of the bridge circuit can be made asymmetric by applying the at least first offset magnetic field to a single one of the magnetoresistive elements. This allows for effectively increasing the unequivocal angular range of a directional magnetic field sensor.

According to another embodiment of the invention, the magnetic field sensor further includes at least a fifth and a sixth magnetoresistive-layered structure and at least a third and fourth soft magnetic planar structure. The third and fourth soft magnetic planar structures are separated by at least a second elongated gap and the direction of the second elongated gap is substantially perpendicular to the direction of the first elongated gap. The at least fifth and sixth magnetoresistive-layered structures are positioned along the at least second elongated gap and are further arranged in a second bridge circuit.

In this way the magnetic field sensor includes a first and a second bridge circuit each of which being adapted to determine the direction of an external magnetic field. Since the first and the second elongated gaps belong to the first and the second bridge circuit, respectively, the first bridge circuit is adapted to provide an output voltage being indicative of the magnitude of a first component of the external magnetic field pointing in a first direction, and the second bridge circuit is adapted to provide a corresponding second output signal being indicative of a second component of the external magnetic field that points in a substantially perpendicular direction.

The output signal of both bridge circuits can be subjected to a shift that is due to a first and a second offset magnetic field. In this way, each bridge circuit provides an output signal that allows to unequivocally determine the magnitude of the external magnetic field. In particular, if the magnitude of the external magnetic field is constant but the direction of the magnetic field may be subject to modification, the magnitude as well as the sign of a spatial component of the external magnetic field can be determined. Combining these output signals of the first and the second bridge circuit provides unequivocal determination of the direction of an external magnetic field over a range from 0° to 360°.

In another embodiment of the invention, a method measures an external magnetic field by using a magnetic field sensor that has at least a first magnetoresistive-layered structure. The method includes generation of an at least first offset magnetic field and measuring the electrical resistance of the at least first magnetoresistive-layered structure. This electrical resistance depends on the magnitude of a first magnetic field that includes components of the external magnetic field and components of the offset magnetic field. Typically, the external and the offset magnetic field superimpose and form a superimposed magnetic field that in turn has an impact on the electrical resistance of the magnetoresistive-layered structure. In this way, the electrical resistance of the at least first magnetoresistive-layered structure is indicative of the magnitude and/or the direction of the superimposed magnetic field. Having knowledge of the magnitude and/or the direction of the generated offset magnetic field, the magnitude and/or the direction of the external magnetic field can be precisely determined.

According to another embodiment of the invention, measuring the electrical resistance of the at least first magnetoresistive-layered structure further includes measuring the electrical resistance of the at least first magnetoresistive-layered structure during modification of a first component of the at least first offset magnetic field. This first component of the offset magnetic field has a first direction, for instance, such that it points in the x-direction. The electrical resistance of the at least first magnetoresistive-layered structure is measured during modification of a second component of the at least first offset magnetic field. This second component has a second direction, which is, for example, perpendicular to the first direction. For example, the second direction points in the z-direction.

In this way, the electrical resistance of the at least first magnetoresistive-layered structure is separately measured as a function of the first and the second component of the at least first offset magnetic field. Finally, the magnitude and/or the direction of the external magnetic field can be determined by measuring the magnitude of the first and the second components of the at least first offset magnetic field for which the electrical resistance of the at least first magnetoresistive-layered structure is maximal or has a predefined value.

In particular, when the at least first magnetoresistive-layered structure is implemented as a GMR element, the electrical resistance is maximal for zero superimposed magnetic field, such as when external and offset magnetic field mutually compensate. By varying a component of the offset magnetic field in the presence of the external magnetic field, the maximum of the electrical resistance of the at least first magnetoresistive-layered structure will arise if the component of the at least first offset magnetic field substantially compensates for a corresponding component of the external magnetic field. In the case of such compensation, the magnitudes of the offset component and the corresponding component of the external magnetic field are substantially equal.

Performing this compensation procedure for both components of the offset magnetic field allows for a determination of the offset magnetic field vector in the plane given by the first and the second directions, such as within the x-y-plane. In this way, the offset magnetic field can be determined for which the electrical resistance of the at least first magnetoresistive-layered structure becomes maximal. Since this maximal electrical resistance is an indication of a substantial compensation of the external magnetic field, the magnitude and direction of the external magnetic field can therefore be precisely determined. The magnitude of the external magnetic field substantially equals the magnitude of the offset magnetic field and its direction is reversed with respect to the offset magnetic field.

This embodiment allows for a precise determination of the magnitude and direction of the external magnetic field in a two-dimensional plane governed by the first and second directions. When, for example, the external magnetic field further includes a magnetic field component in the third spatial direction, such as the y-direction, the method just allows for determination of its two components lying in the x-z-plane. By implementing the magnetic field sensor in a rotatable way, in principle a third spatial component of the external magnetic field also can be determined. For example, the magnetic field sensor can be rotated in such a way that the first direction points in the y-direction and the second direction still points in the z-direction. Performing a corresponding procedure, the y- and z-component of the external magnetic field can be determined.

According to another embodiment of the invention, the magnetic field sensor further includes at least a second magnetoresistive-layered structure. The at least first and the at least second magnetoresistive-layered structures are arranged in a first bridge circuit and the method of measuring the external magnetic field further includes generation of the at least first offset magnetic field that has a first direction and a first magnitude. This first magnitude of the at least first offset magnetic field is substantially larger than the magnitude of the external magnetic field that has to be measured by the magnetic field sensor.

A corresponding first output signal of the bridge circuit is next measured and stored. Thereafter, an at least second offset magnetic field is generated that has a second direction and a second magnitude. This second direction is substantially antiparallel to the first direction and the second magnitude is substantially equal to the first magnitude. Hence, the second offset magnetic field represents the reversed first offset magnetic field. Then, a corresponding second output signal of the bridge circuit is measured. Finally, the magnitude of the external magnetic field can be precisely determined by comparing the first and the second output signals of the bridge circuit. Typically, the first and second output signals of the bridge circuit include a first and second output voltage.

The magnitude of the external magnetic field can then be obtained by subtracting first and second output voltages. The resulting voltage signal is indicative of twice the magnitude of the external magnetic field but is independent of the magnitude and direction of the at least first and second offset magnetic field as well as any offset voltage of the bridge circuit. In this way, even a very small external magnetic field, such as the earth magnetic field, can be precisely measured. The inventive method therefore enhances the sensitivity of a magnetic field sensor and effectively allows for offset compensation of a bridge circuit, such as a Wheatstone bridge.

According to another embodiment of the invention, the at least first and second magnetoresistive-layered structures are arranged in a first bridge circuit and the method of measuring the external magnetic field further includes generating of a balance of the bridge circuit in the absence of the external magnetic field. Generation of the balance further includes generation of the at least first offset magnetic field, such as in the vicinity of the at least first magnetoresistive-layered structure. Here, the at least first offset magnetic field is generated locally in close proximity to the at least first magnetoresistive-layered structure and does not have an impact on the at least second magnetoresistive-layered structure.

Thereafter, the balance of this first bridge circuit is generated in the presence of the external magnetic field. The generation of this balance includes generation of an at least second offset magnetic field. This second offset magnetic field can be generated in the vicinity of the at least first or second magnetoresistive-layered structure. The magnitude and/or direction of the external magnetic field can be determined by comparing the at least first and second offset magnetic fields.

According to another embodiment of the invention, the sensor further includes at least a first and a second soft magnetic planar structure that are separated by at least a first elongated gap. The at least first magnetoresistive-layered structure is positioned along the at least first elongated gap. The method of measuring the external magnetic field includes generating the at least first offset magnetic field in the vicinity of the at least first magnetoresistive-layered structure, and measuring a first output signal of the first bridge circuit in the presence of the external magnetic field and the at least first offset magnetic field. The method further includes determining of the magnitude of a first component of the external magnetic field on the basis of the output voltage and the magnitude of the at least first offset magnetic field.

The direction of the first component of the external magnetic field can be substantially perpendicular to the direction of the elongated gap. In this embodiment, the at least first and second soft magnetic planar structures serve as flux guides in order to decompose the external magnetic field into various spatial components. The at least first magnetoresistive-layered structure is adapted to measure a first component of the external magnetic field that points in a perpendicular direction compared to the elongation of the gap.

Typically, the bridge circuit is implemented as a Wheatstone bridge having at least a first and a second magnetoresistive-layered structure for determining two components of the external magnetic field. Generation of the at least first offset magnetic field in the vicinity of only one magnetoresistive element then serves to shift the balance of the bridge circuit. Without any offset field, the output signal of a bridge circuit is a function of the absolute value of the external magnetic field. By applying an offset magnetic field, the magnetic field at the sensor position never changes the direction as long the offset field does not change the direction and the magnitude of the external field is smaller than the magnitude of the offset field. Under this condition, the range of unequivocal determination of a direction of an external magnetic field can be enhanced from 0° to 90° to 0° to 180°.

In another embodiment of the invention, an electronic device determines a direction of an external magnetic field. The electronic device includes means, or a mechanism, for generating of an at least first offset magnetic field, at least a first magnetoresistive-layered structure that has an electrical resistance that depends on the magnitude of a first magnetic field. This first magnetic field includes components of the external magnetic field and components of the offset magnetic field. The electronic device further includes a control unit for controlling generation of the at least first offset magnetic field and for determining the direction of the external magnetic field on the basis of the magnitude of the at least first offset magnetic field and the electrical resistance of the at least first magnetoresistive-layered structure.

Still other embodiments and aspects of the invention will become apparent by reading the detailed description that follows, and by referring to the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
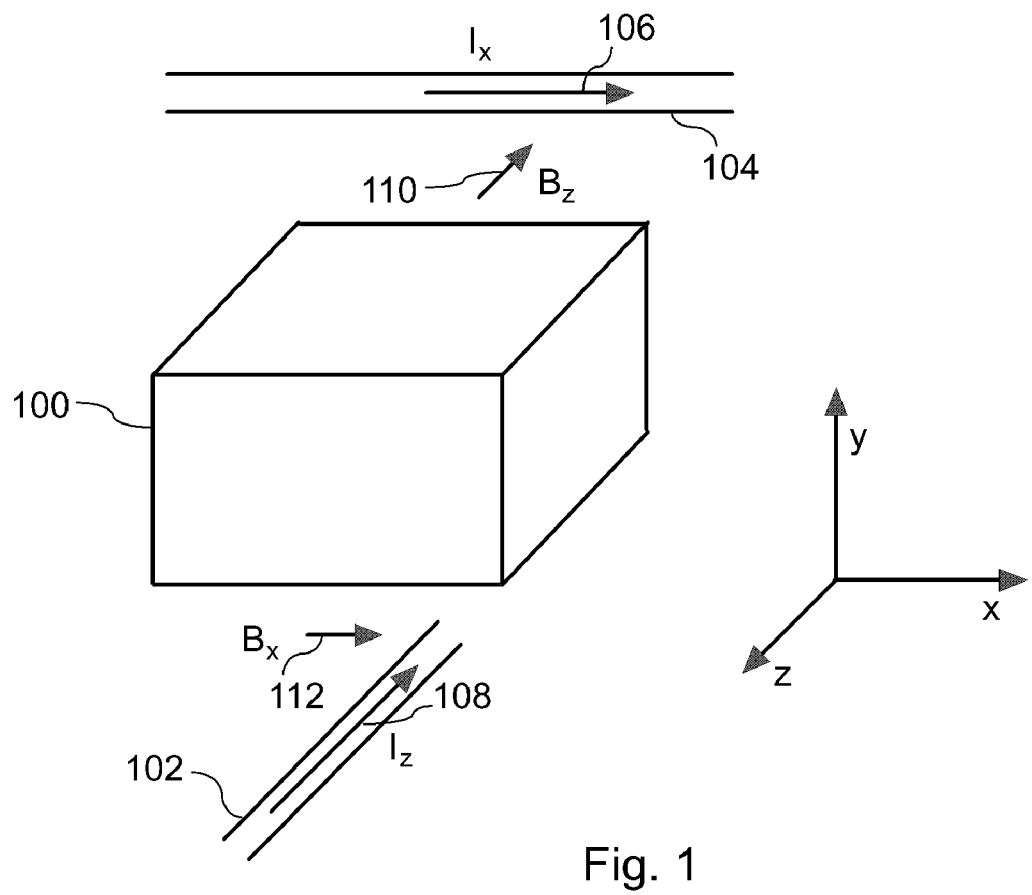
FIG. 1 is a diagram schematically illustrating a magnetoresistive-layered structure with first and second means, or mechanisms, for generating first and second components of the offset magnetic field by using straight wires, according to an embodiment of the invention.

FIG. 1 schematically illustrates a magnetic field sensor having a magnetoresistive-layered structure 100 and first and second means, or mechanisms, for generating first and second components of an offset magnetic field, according to an embodiment of the invention. The first and second means, or mechanisms, for generating first and second components of the offset magnetic field are implemented in the embodiment of FIG. 1 by electrically conducting wires 102, 104. Wire 102 is arranged along the z-direction near the bottom side of the magnetoresistive-layered structure 100 and provides flow of a current $I_z$ 108. When flowing through the wire 102, the current 108 generates a magnetic field 112 that points in the x-direction near the bottom side of the magnetoresistive-layered structure 100.

In a similar way the second wire 104 is arranged along the x-direction and provides flowing of a current 106. The wire 104 is arranged near the top side of the magnetoresistive-layered structure 100. When the current $I_x$ 106 flows through the wire 104, it generates a component of the magnetic offset field 110 that points in the z-direction in close proximity to, or near, the upper side of the magnetoresistive-layered structure 100.

In this way, an offset magnetic field having components in the x- and z-direction can be generated by the two currents $I_x$ 106 and $I_z$ 108. In one embodiment, the magnitude and direction of the currents 106 and 108 is controllable and hence the direction and magnitude of the resulting offset magnetic field can be arbitrarily modified in the x-z plane. In one embodiment, the magnetoresistive-layered structure 100 is implemented as a GMR element providing an electrical resistance that depends on the magnitude of an applied magnetic field, such as a superimposed magnetic field. By varying the current 106 and simultaneously monitoring the electrical resistance of the magnetoresistive-layered structure 100, a maximum electric resistance can be determined when the corresponding component 110 of the offset magnetic field exactly compensates the z-component of the external magnetic field.

Subsequently and in the same way, the current 108 can be modified in order to determine a component 112 of the offset magnetic field that exactly compensates the x-component of the external magnetic field. The two values of the currents 106 and 108 that lead to the maximum electric resistance of the magnetoresistive-layered structure 100 are then indicative of the magnitudes of the x- and z-components of the offset magnetic field that exactly compensates the external magnetic field. In this way the magnitude and direction of the external magnetic field in the x-z-plane can be precisely determined.

Generation and variation of the currents 106 and 108 can be provided by a control unit that may also provide measuring of the electrical resistance of the magnetoresistive-layered structure 100. Determination of the maximum electric resistance of the magnetoresistive-layered structure 100 can be realized by making use of a corresponding control loop, for instance.

Figure 2:
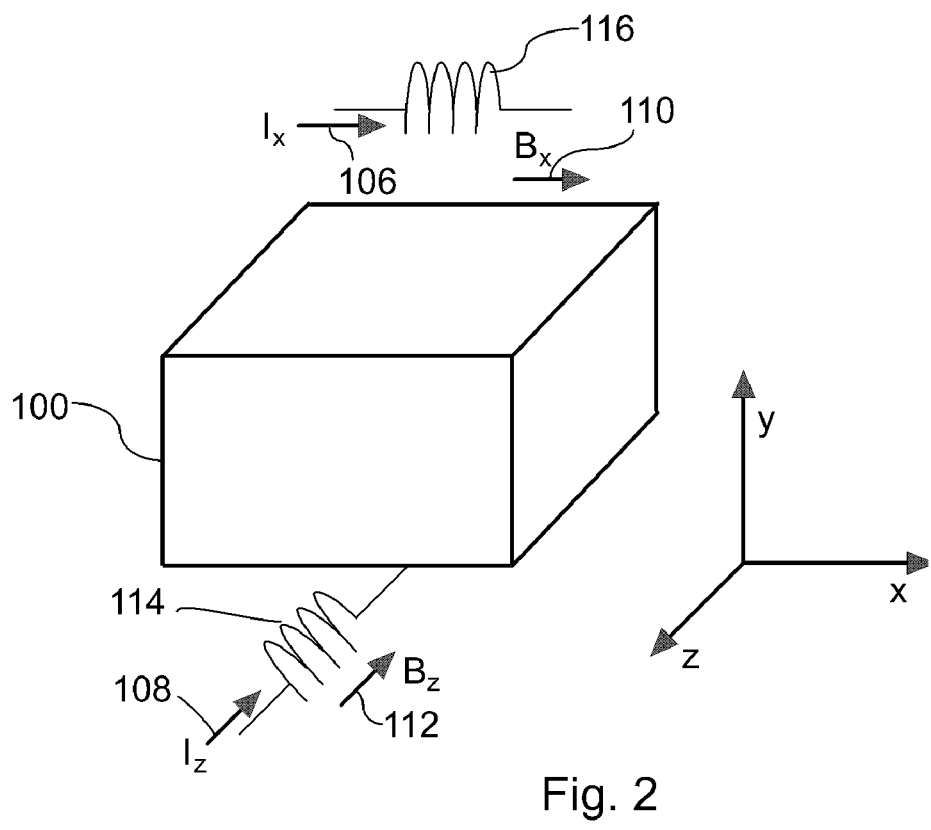
FIG. 2 is a diagram schematically illustrating a magnetoresistive-layered structure with first and second means, or mechanisms, for generating first and second components of the offset magnetic field by using coils, according to an embodiment of the invention.

FIG. 2 shows an alternative embodiment of the magnetic field sensor, wherein the electrical conducting wires 104 and 102 are effectively replaced by inductive elements 114, 116, that are, for instance, implemented as coils. In the embodiment of FIG. 2, coil 116 provides generation of a magnetic field component 110 in the x-direction and coil 114 provides generation of a perpendicular magnetic field component 112 pointing in the z-direction. Compared to the embodiment of FIG. 1, the coils 114, 116 in the embodiment of FIG. 2 provide respective magnetic field components 112 and 110 that are larger in magnitude when currents 106 and 108 are applied.

Figure 3:
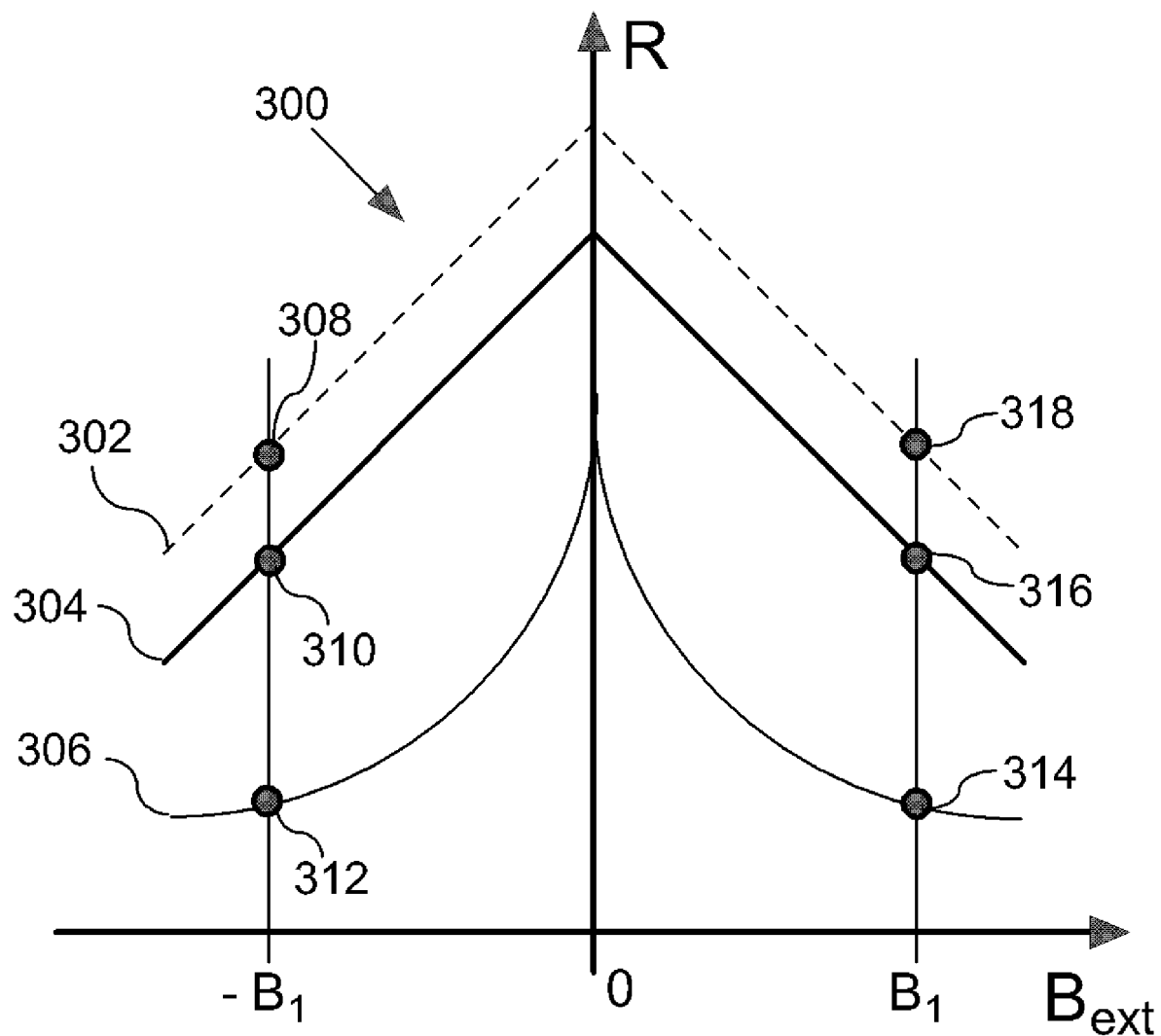
FIG. 3 is a diagram of the electrical resistance of a magnetoresistive-layered structure versus the magnitude of the external magnetic field, according to an embodiment of the invention.

FIG. 3 depicts a resistance diagram 300 reflecting the electrical resistance of the magnetoresistive-layered structure 100 versus an applied external magnetic field or a superimposed magnetic field, according to an embodiment of the invention. This applied external or superimposed magnetic field has components of the external magnetic field and of the offset magnetic field generated by the wires 102, 104 or by the coils 114, 116, as illustrated in FIGS. 1 and 2. The resistance diagram 300 can be for the electric resistance of a GMR element depending on an applied magnetic field. The electric resistance may be symmetric with respect to zero applied magnetic fields. Additionally, the electric resistance is maximal for zero applied magnetic fields.

In the illustrated resistance diagram 300 three resistance curves 302, 304 and 306 are depicted. The linear resistance curve 302 that is illustrated as dashed line features a constant offset compared to the linear resistance curve 304 that is illustrated as a solid line. In contrast to the linear resistance curves 302 and 304, the resistance curve 306 is non-linear. The three resistance curves 302, 304, 306 may refer to different type series of GMR elements or to the same GMR element that is operated under varying external conditions, such as varying temperature or varying voltage or current applied to the respective GMR element. By applying an external magnetic field of a strength of minus $B_1$, three intersection points 308, 310, and 312 for the various GMR elements can be obtained.

To each intersection point 308, 310, and 312 a corresponding electric resistance of the magnetoresistive-layered structure can be determined. By using a GMR element featuring the linear resistance curve 304, in principle the electric resistance corresponding to intersection point 310 can be measured. Using the knowledge of the linear resistance curve 304 as well as the knowledge of the external parameters, for which this particular linear resistance curve 304 is valid, the magnitude of the applied magnetic field $B_1$ can then be determined.

For example, due to a different temperature, the linear resistance curve 304 might be shifted to the linear resistance curve 302. In this case, the electric resistance corresponding to the intersection 308 is different than the electrical resistance corresponding to the intersection 310. Hence, measuring an absolute value of the electric resistance of a magnetoresistive-layered structure is not insensitive to an offset that may arise due to varying external conditions.

Any influence that shifts the resistance curve 304 to a resistance curve like 302 or 306 does not change the value of the corresponding magnetic field where the resistance of each curve has its maximum. This means the maximum of the resistance curve is insensitive to any shift of the resistance curve. By applying an offset magnetic field of varying magnitude and simultaneously monitoring the corresponding electric resistance of the magnetoresistive-layered structure, the maximum electric resistance can be determined. The offset magnetic field that has to be applied in order to obtain the maximum electric resistance is then directly indicative of the magnitude of the external magnetic field irrespective of a particular linear or non-linear resistance curve 302, 304, and 306 that is valid for the GMR element.

In the resistance diagrams shown in FIG. 3 the maximum resistance is at the point where the superimposed magnetic field is zero. Hence, by generating an offset magnetic field of equal magnitude and opposite direction than the magnitude and direction of the external magnetic field, the resistance reaches its maximum. Because the magnitude and sign of the external magnetic field can be determined directly from the offset field this approach is insensitive to an offset of a resistance diagram. Furthermore, determination of the maximum electric resistance of the GMR element can be accomplished by generating an offset magnetic field that is universally applicable to linear and non-linear resistance curves 302, 304, and 306 of a GMR element.

An arbitrary direction of the magnetic offset field can be created in the sensitive plane (x-z plane) of the magnetic sensitive material. Using a feedback loop, the external magnetic field in the sensitive plane of the magnetic sensitive material can be compensated for by the offset magnetic field so that the resistance of the magnetic sensitive material reaches its maximum. By knowing the magnetic offset field, the magnitude and direction of the external magnetic field can be determined.

As a result, the magnitude and sign of the two components Bx and Bz in the x-z plane can be determined. The combination of a magnetic sensitive element, which reduces its resistance when a magnetic field is present in its sensitive plane, and a means, or mechanism, to create an arbitrary magnetic offset field in this plane, allows the magnitude and direction of an external magnetic field to be measured within a range of 0° to 360°.

Moreover if a magnetic-sensitive material or device is used that reduces the resistance or another measurable property depending on the magnitude and direction of an external magnetic field, a means or mechanism to create a magnetic offset field in any spatial direction can compensate for the external magnetic field by using a feedback loop approach. By knowing the magnetic offset field, for instance, the magnitude and spatial direction of external magnetic field can be determined. Consequently, the magnitude, the bearing, and the declination of the external magnetic can be determined.

Instead of using a magnetic-sensitive material or a magnetic-sensitive device that reduces the resistance or any other measurable property if a magnetic field is applied, a material or device that increases in resistance or any other measurable property can instead be correspondingly used. Because a feedback approach can be employed, it is not necessary that the transfer curve of the material of the device is linear.

Instead of compensating the external magnetic field by the offset magnetic field, such as by retrieving the maximum electric resistance of the GMR element, the offset magnetic field may be modified in such a way that the electric resistance of the GMR element corresponds to the initial electric resistance. For example, initially an electric resistance is determined that corresponds to the intersection point 310, and the offset magnetic field can be modified until the same electric resistance that corresponds to intersection point 316 is measured. Hence, the offset magnetic field is modified in such a way that it substantially equals twice the magnitude of the external magnetic field $B_1$. In this way, the method effectively allows to compensate a horizontal offset of the linear and non-linear resistance curves 302, 304, and 306.

Measuring the initial electric resistance corresponding to intersection point 308 then requires modification of the offset magnetic field in order to move on the linear resistance curve 302 up to the intersection point 318. In the same way, the intersection point 312 is started from and the offset magnetic field is modified until the intersection point 314 is reached.

Figure 4:
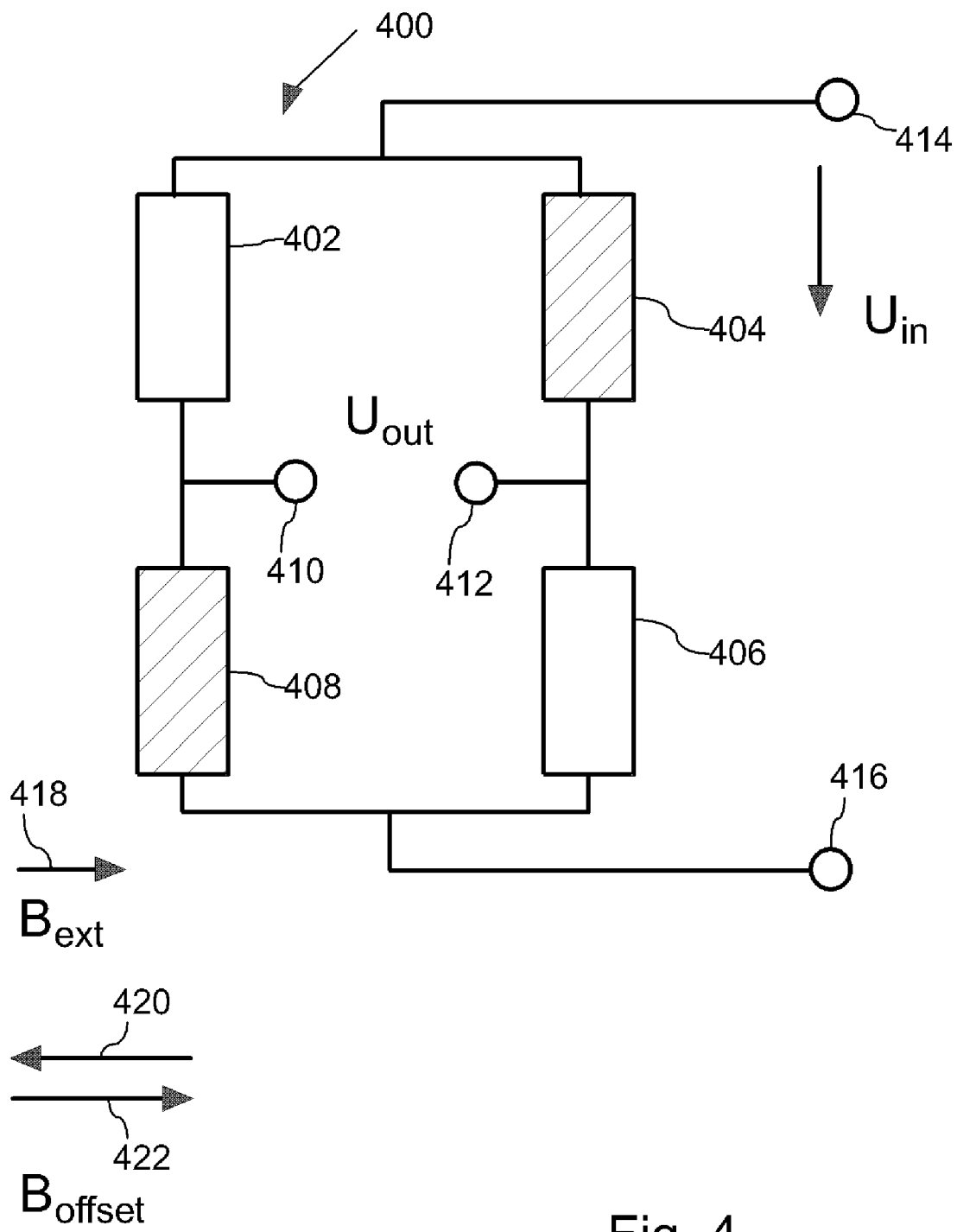
FIG. 4 is a diagram schematically showing a Wheatstone bridge arrangement having at least first and second magnetoresistive-layered structures, according to an embodiment of the invention.

FIG. 4 schematically illustrates a bridge circuit 400 that is implemented as a Wheatstone bridge having four resistive elements 402, 404, 406, and 408, according to an embodiment of the invention. At least two of the resistive elements are implemented as magnetoresistive-layered structures 402 and 406. These magnetoresistive-layered structures 402 and 406 can be implemented as GMR elements and they are arranged in an opposite or diagonal way within the bridge circuit 400. The bridge circuit 400 further has two input terminals 414 and 416 for applying an input voltage or an input current and further has two output terminals 410 and 412 that are arranged between the GMR element 402 and the resistor 408, and between the GMR element 406 and the resistor 404, respectively. The two resistors 404 and 408 can be insensitive to a magnetic field. They can in principle be implemented as GMR elements of the same type series as the GMR elements 402 and 406 in order to provide substantially equal electrical properties. However, when implemented as GMR elements, the resistors 404 and 408 are desirably shielded from an external or offset magnetic field by using a soft magnetic material, for instance. Upon applying an external magnetic field 418, the electric resistance of the oppositely arranged GMR elements 402 and 406 may change, leading to a voltage signal across the two output terminals 410, 412.

Figure 5:
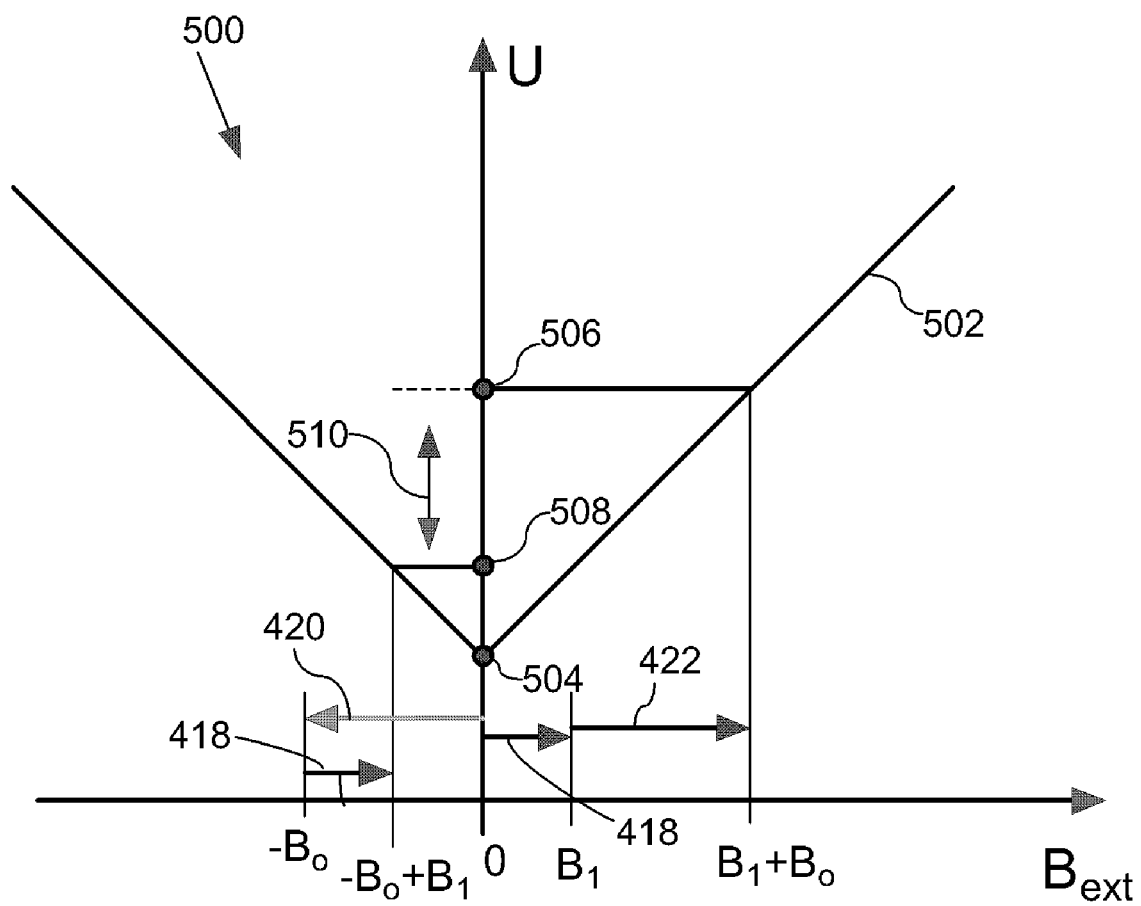
FIG. 5 is a diagram of the output voltage of a Wheatstone bridge versus an externally applied magnetic field, according to an embodiment of the invention.

In FIG. 5 a corresponding bridge output diagram 500 is shown that illustrates the output voltage 502 versus the magnitude of an applied magnetic field, according to an embodiment of the invention. In the absence of a magnetic field, the output voltage of the bridge circuit 400 is minimal as is seen from the intersection point 504. This minimal output voltage 504 does not necessarily have to be equal to zero, because the bridge circuit can be subject to some offset drift that may result from manufacturing tolerances of the resistors 402, . . . , 408.

FIG. 5 shows the effect of superimposing an offset magnetic field 422 on top of the external magnetic field 418. In relation to FIG. 5, the external magnetic field is denoted as $B_1$ and the offset magnetic field is denoted as $B_o$. By generating an offset field 422 in the direction of the external magnetic field 418, the superimposed magnetic field $B_1$ plus $B_o$ results in a first voltage at intersection point 506. In a second measurement, the direction of the offset magnetic field is reversed and forms a second offset magnetic field 420. Since the offset magnetic field 422 and 420 is larger in magnitude than the external magnetic field 418, a second voltage can be determined that corresponds to the intersection point 508. In relation to FIG. 5, the first voltage refers to a positive superimposed magnetic field and the second voltage refers to a negative superimposed magnetic field, such as the second superimposed magnetic field points in the opposite direction than the first superimposed magnetic field.

By subtracting the first and second voltage signals that correspond to the first and second intersection points 506, 508 a voltage difference 510 is obtained. This voltage difference is indicative of twice the magnitude of the external magnetic field $B_1$. Additionally, the voltage difference 510 is independent of any bridge offset and is independent of the offset magnetic field $B_o$. Hence, by applying an offset magnetic field that is larger in magnitude than the field to be measured, an offset compensation of a Wheatstone bridge can be effectively realized. In this way, the sensitivity of a magnetic field sensor making use of a Wheatstone bridge arrangement can be enhanced. Furthermore, this approach is insensitive to any offset shift of the output U, because the shift influences the intersection 508 and 506 in the same way, and by subtracting the value of intersection 506 from that of the intersection 508 the offset shift is effectively eliminated.

The two offset magnetic fields 422, 420 can be generated globally, such that, for instance, the offset magnetic field affects the electric resistance of GMR elements 402 and 406 in almost the same way. This can be achieved by arranging equal means, or mechanisms, for generating offset magnetic fields in close proximity to GMR elements 402 and 406.

Figure 6:
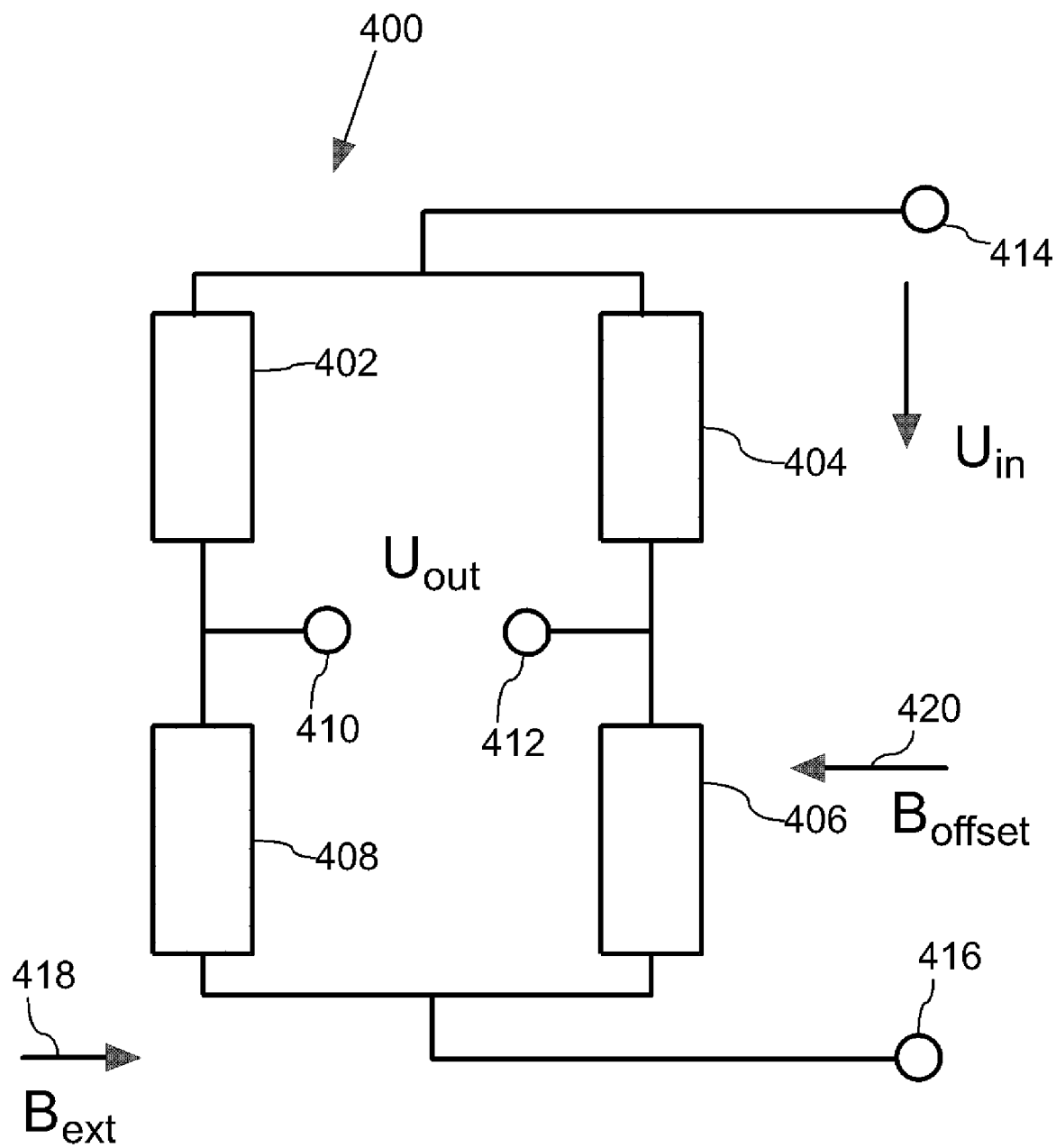
FIG. 6 is diagram schematically showing a Wheatstone bridge arrangement with a locally applied offset magnetic field, according to an embodiment of the invention.
Figure 7:
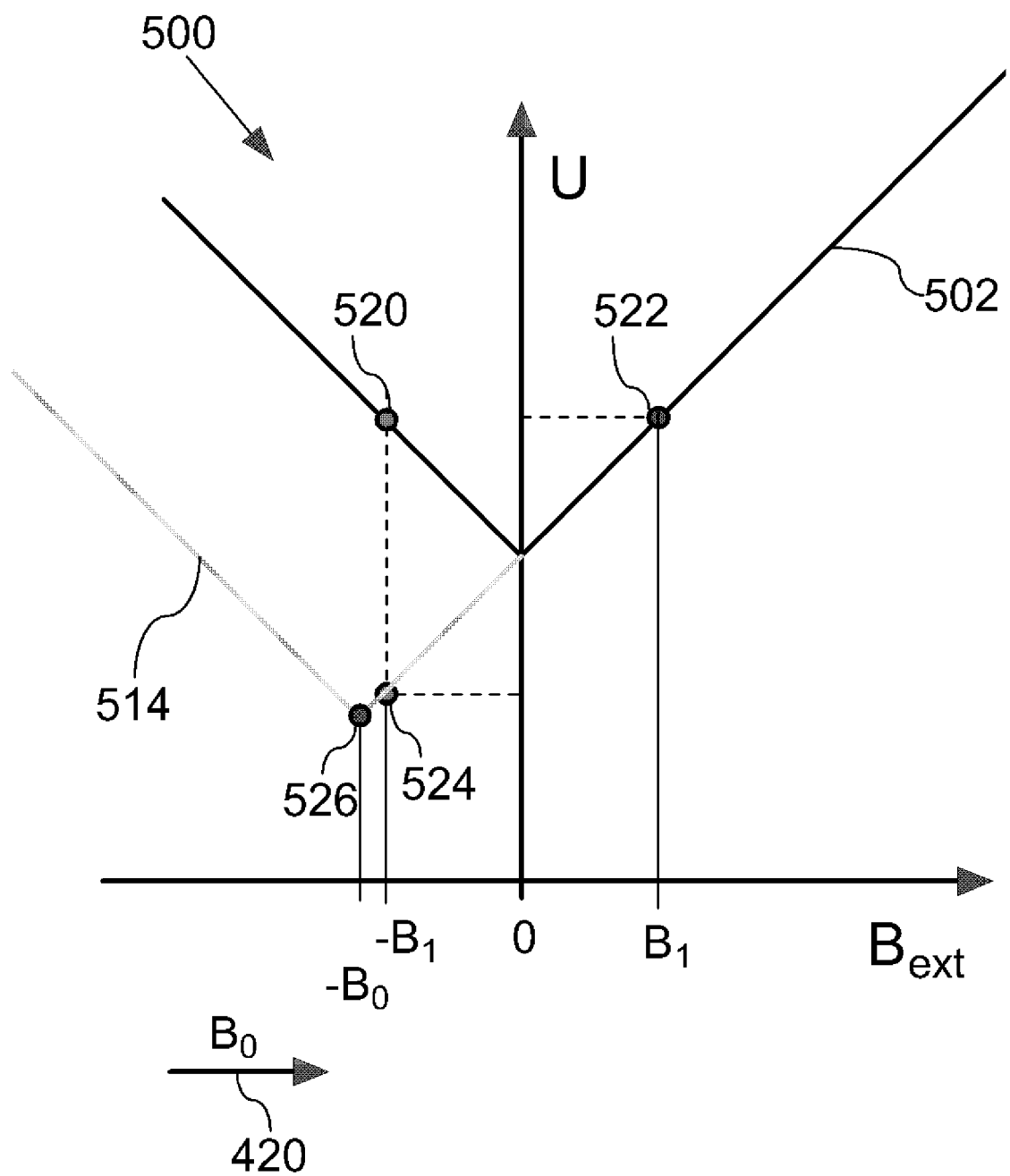
FIG. 7 is a diagram of an output voltage diagram of a Wheatstone bridge arrangement with a local offset magnetic field, according to an embodiment of the invention.

FIG. 6 schematically illustrates the same bridge circuit as FIG. 4, except that the offset magnetic field 420 is only locally applied to at least one of the magnetoresistive-layered structures 402 and 406, according to an embodiment of the invention. The offset magnetic field 420 may be applied to only one GMR element 406 in order to shift the bridge output diagram 500, as is illustrated in FIG. 7. By applying a positive offset magnetic field $B_o$, the minimum of the output curve 520 shifts to the left by an amount $-B_o$. Consequently, the output curve 502 is transformed to the shifted output curve 514. The minimum voltage that corresponds to the intersection point 526 can be obtained when the external magnetic field equals $-B_o$.

Applying an external magnetic field of $B_1$ results in a voltage signal that corresponds to the intersection point 522. By using the output curve 502 and measuring such a voltage signal, the intersection points 520 and 522 cannot be properly distinguished. The measured output voltage signal may either correspond to a positive or negative external magnetic field of magnitude $B_1$. Therefore, by applying the offset magnetic field locally at one of the magnetoresistive elements 406, the shifted output curve 514 is valid. Hence, the intersection point 526 corresponding to a minimal output voltage is shifted to the left, allowing for an unequivocal determination of the external magnetic field over a range from at least $-B_o$ to $+B_o$.

Intersection point 520 effectively moves to intersection point 524. The two intersection points 522 and 524 that correspond to different magnitudes of external magnetic field now correspond also to different voltage outputs of the bridge circuit 400. Therefore, not only the magnitude but also the sign and hence the direction of an applied external magnetic field can be determined by the illustrated shift of the output curve 502.

Figure 8:
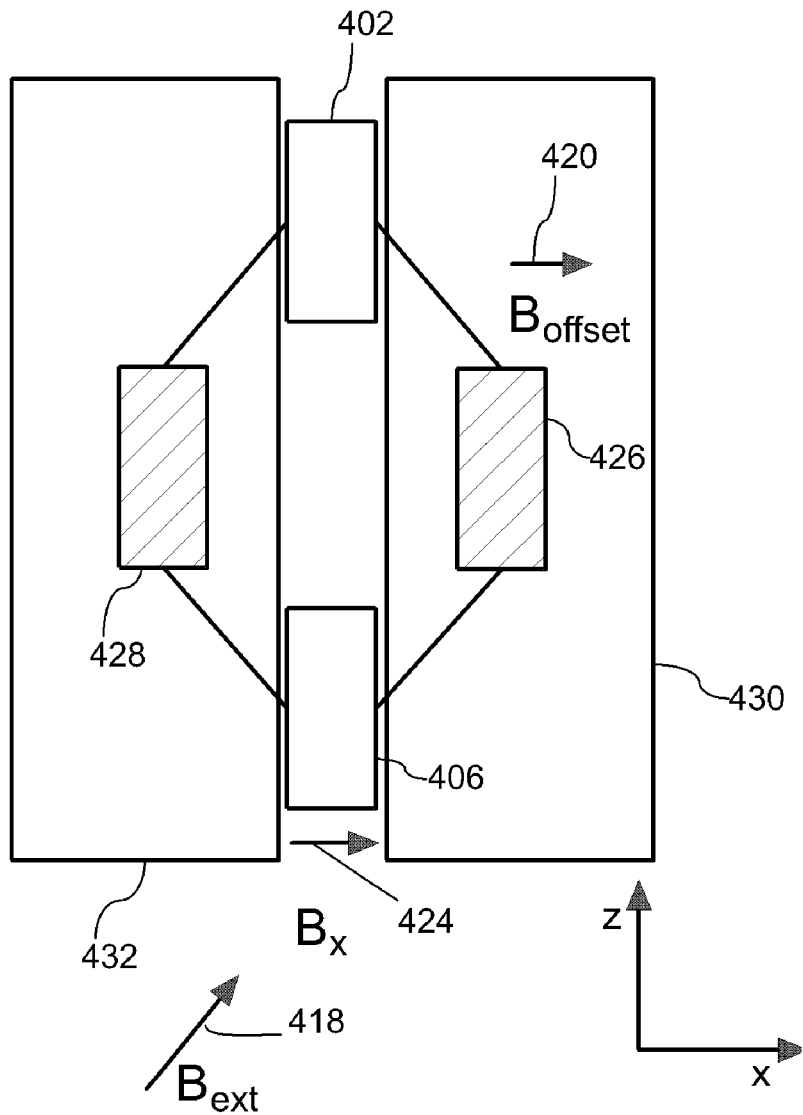
FIG. 8 is a diagram of a Wheatstone bridge arrangement having four magnetoresistive-layered structures, two of which are shielded from an external magnetic field, according to an embodiment of the invention.

Shifting of an output curve of a bridge circuit may be applicable or useful when the bridge is adapted to determine the magnitude of a particular spatial component of the external magnetic field. FIG. 8 is illustrative of such an embodiment that uses two flux guides 430 and 432 that include a soft magnetic material. These flux guides 430 and 432 serve to screen the external magnetic field 418. When arranged in close proximity, or near one another, such that the two flux guides 430 and 432 form an elongated gap (along the z-direction as illustrated in FIG. 8), the magnetic field that can be measured between the two flux guides 430 and 432 substantially represents the x-component 424 of the externally applied magnetic field 418.

The flux guides 430 and 432 may not only serve to separate the components of the externally applied magnetic field but may also serve to shield the GMR elements 426, 428 of the bridge circuit 400, in one embodiment of the invention. The other two GMR elements 402 and 406 are then sensitive to the magnitude of the x-component 424 of the externally applied magnetic field. Applying an offset magnetic field 420 to, for instance, GMR element 426, can result in the output curve 502 of the bridge circuit 400 being shifted as illustrated in FIG. 7. Consequently, the output voltage obtained from the bridge circuit of FIG. 8 is suitable for determining the magnitude of the x-component 424 as well as its sign, such as whether it points in the positive or negative x-direction.

When the magnitude of the external magnetic field 418 is smaller than the magnitude of the offset magnetic field 420, the bridge circuit illustrated in FIG. 8 may provide unequivocal determination of the x-component of the externally applied magnetic field. In the same way, a second bridge circuit can be implemented that is rotated by 90° and thus provides a corresponding determination of the z-component of the external magnetic field. Combining the corresponding output voltages of the x-component bridge circuit and the z-component bridge circuit, a directional magnetic sensor can be realized that allows for an unequivocal determination of the direction of an external magnetic field over a range from 0° to 360°.

Figure 9:
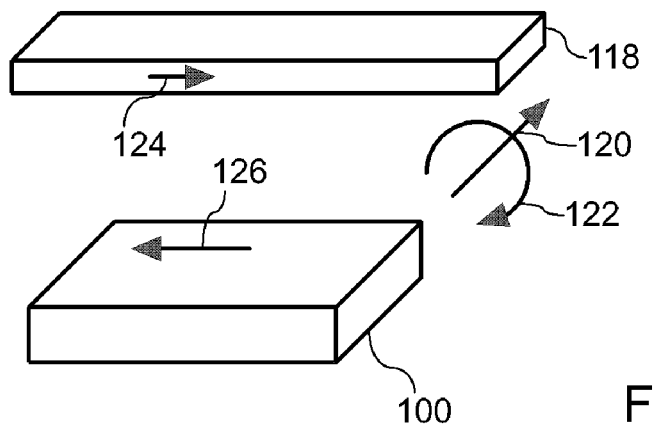
FIG. 9 is a diagram schematically showing generation of a constant offset magnetic field by magnetizing a soft magnetic material, according to an embodiment of the invention.

FIG. 9 schematically illustrates generation of a constant offset magnetic field by using a magnetoresistive-layered structure 100 and a soft magnetic element 118, according to an embodiment of the invention. In order to measure the electric resistance of the magnetoresistive-layered structure 100, a current 120 is applied that flows through the magnetoresistive-layered structure 100. Consequently, the current 120 generates a magnetic field 122 in a radial direction with respect to the current direction. When the magnitude of the current 120 is above a predetermined threshold, the corresponding magnetic field 122 may serve to entirely magnetize the soft magnetic element 118. Hence, the soft magnetic element 118 may feature a saturated magnetization 124.

The threshold value for the magnitude of the current 120 can be governed by the saturation of the magnetization of the soft magnetic element 118. The corresponding demagnetization field 126 is then present at the magnetoresistive-layered structure 100. In one embodiment, this demagnetization field 126 is much larger in magnitude than the magnetic field 122 generated by the current 120. Additionally, when the current 120 is above the predetermined saturation threshold, the demagnetization field 126 remains constant irrespective of the magnitude of the current 120. However, the direction of the demagnetization field can be changed by 180° if the direction of the current is reversed. In this way, a constant magnetic offset field 126, with alterable direction, can be induced by a current 120 flowing through the magnetoresistive-layered structure 100.

Figure 10:
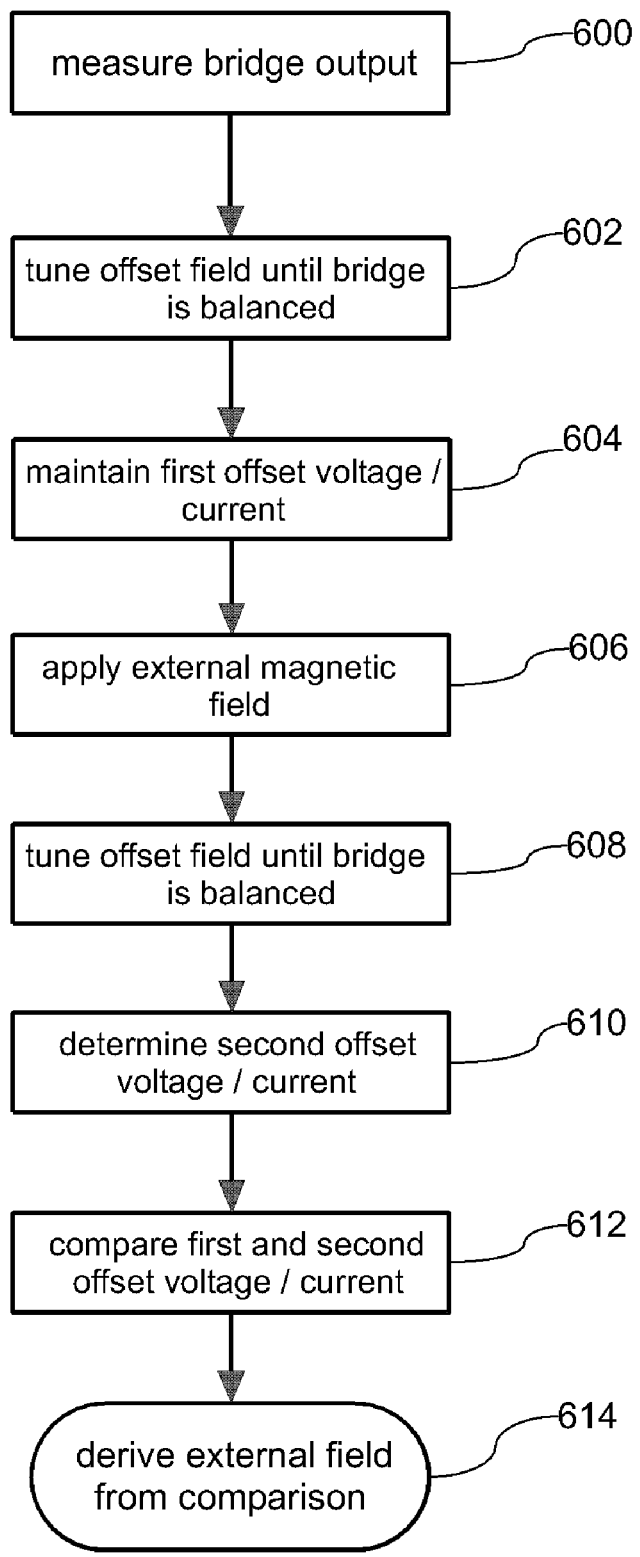
FIG. 10 is a flowchart of a method for determining magnitude and/or direction of an external magnetic field by using a bridge circuit, according to an embodiment of the invention.

FIG. 10 is illustrative of a flowchart of a method for measuring the magnitude and/or the direction of an external magnetic field, using of a bridge circuit, according to an embodiment of the invention. In relation to FIG. 10, a first and/or second offset magnetic field can be locally applied to at least a first and a second magnetoresistive element of the bridge circuit. Furthermore, the bridge may be unbalanced, such that it provides an output voltage even in absence of a magnetic field. In a first part 600 the output voltage of the bridge is measured, which gives an indication that the bridge is subject to some kind of offset drift. In a successive part 602, the offset magnetic field that is applicable to one of the magnetoresistive elements of the bridge is tuned until the bridge is balanced.

In one embodiment, this offset magnetic field is generated by electrical signals, such as by a current flowing through a coil or through a straight wire. In the following part 604 this offset voltage or offset current that is needed to balance the bridge is maintained and stored by a control device that is adapted to control the current flowing through the coil or wire. Thereafter, in part 606 the external magnetic field is applied. Consequently, the output of the bridge no longer remains zero but features some non-zero value.

In the following part 608 the offset magnetic field is repeatedly tuned while the output voltage of the bridge is simultaneously monitored. The offset magnetic field is tuned until the bridge is repeatedly balanced. In one embodiment, this balance occurs for a second offset voltage or corresponding offset current that is determined in the successive part 610. In the following part 612 the first and second offset voltages or first and second offset currents for generating the first and second offset magnetic fields are compared. Finally, in part 614 the external magnetic field can be derived on the basis of the comparison of the first and second output signals performed in part 612.

The illustrated flowchart of the method of FIG. 10 can be used to determine the magnitude of the externally applied magnetic field. Moreover, when the magnetoresistive-layered structures are sandwiched between flux guides that provide decomposition of the external magnetic field into various spatial components, the method of FIG. 10 can also be used to determine the direction of the external magnetic field.

Figure 11:
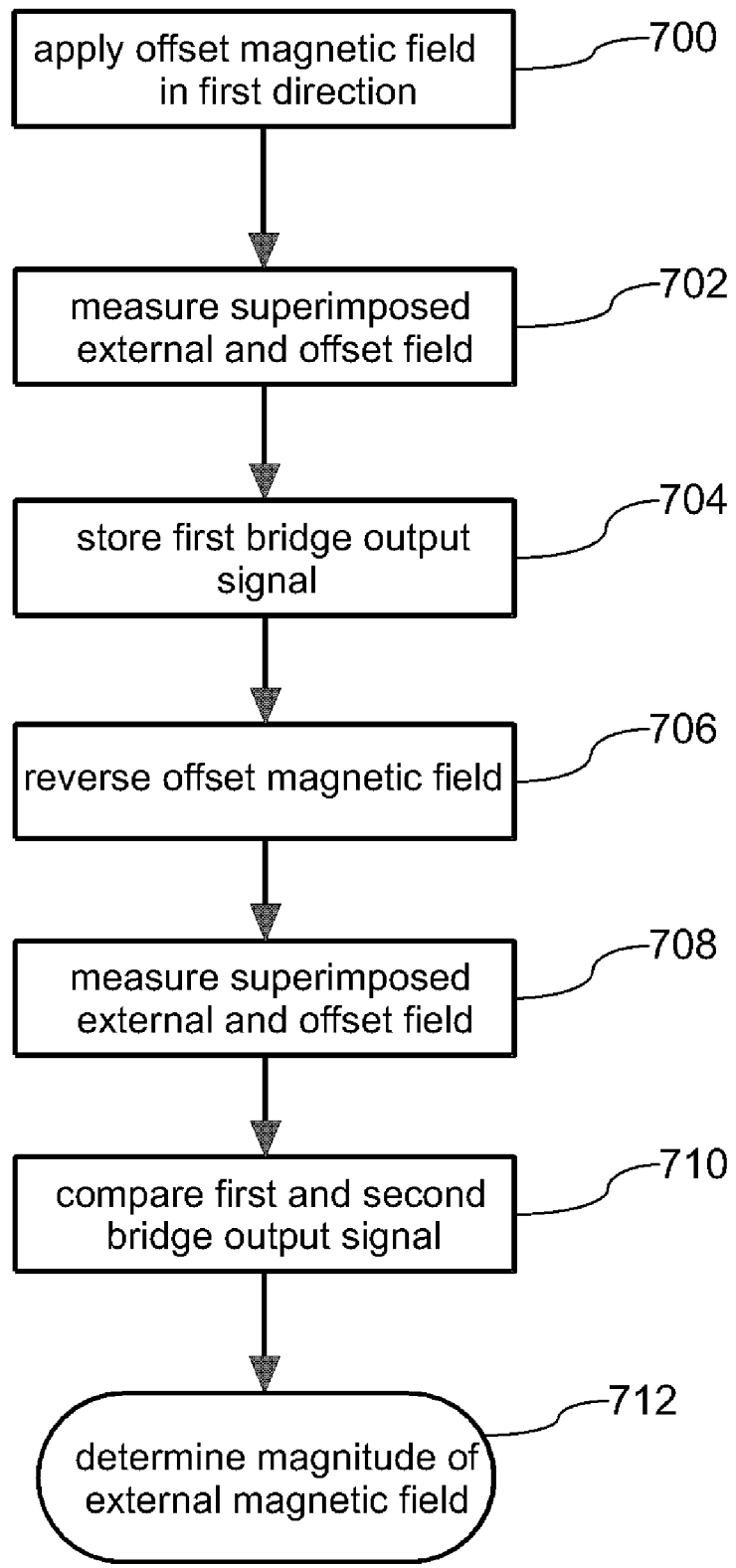
FIG. 11 is a flowchart of a method for determining the magnitude of an external magnetic field by using a bridge circuit, according to an embodiment of the invention.

FIG. 11 illustrates a flowchart of a method for measuring the magnitude of the external magnetic field by simultaneously compensating an offset drift of a bridge circuit, according to an embodiment of the invention. In relation to FIG. 11, a first and a second offset magnetic field of equal magnitude but opposite direction are sequentially applied. In principle, the method of FIG. 11 corresponds to the bridge output diagram 500 illustrated in FIG. 5. In a first part 700 a first offset magnetic field is applied in a first direction. This offset magnetic field $B_o$ is larger in magnitude than the external magnetic field that has to be measured by the bridge circuit.

In a successive part 702, the resulting superimposed magnetic field having components of the external and the offset magnetic field is measured by the output signal produced by the bridge circuit 400. Thereafter, in part 704, this first bridge output is stored. Assuming that the offset magnetic field points in the same direction as the external magnetic field, the first output of the bridge corresponds to a voltage at intersection point 506. After obtaining this first voltage signal, the direction of the offset magnetic field is then reversed in part 706. Since the magnitude of the offset magnetic field is larger than the magnitude of the external magnetic field, the resulting superimposed magnetic field having components of the external field and of the reversed offset magnetic field points in the opposite direction than the external field 418.

In part 708, this second superimposed magnetic field can be measured by the bridge circuit, resulting in a second intersection point 508, as illustrated in FIG. 5, that specifies a second voltage output of the bridge circuit. After sequentially applying the offset magnetic field and the reversed offset magnetic field and obtaining corresponding first and second voltage signals, a voltage difference 510 between the two voltage signals can be determined in part 710 by comparing the first and the second bridge output signal. This voltage difference 510 is directly indicative of the magnitude of the external magnetic field. In particular, the voltage difference 510 is proportional to twice the external magnetic field. Therefore, from the comparison of the first and second bridge output signals in the final part 712, the magnitude of the external magnetic field can be precisely determined. In particular, the determination of the magnitude of the external magnetic field is independent of the magnitude of the offset magnetic field $B_o$. Moreover, the voltage difference is independent of any offset of the bridge circuit so long as the first and the second obtained voltage signals refer to different edges of the output curve 502 of the bridge output diagram 500.

Figure 12:
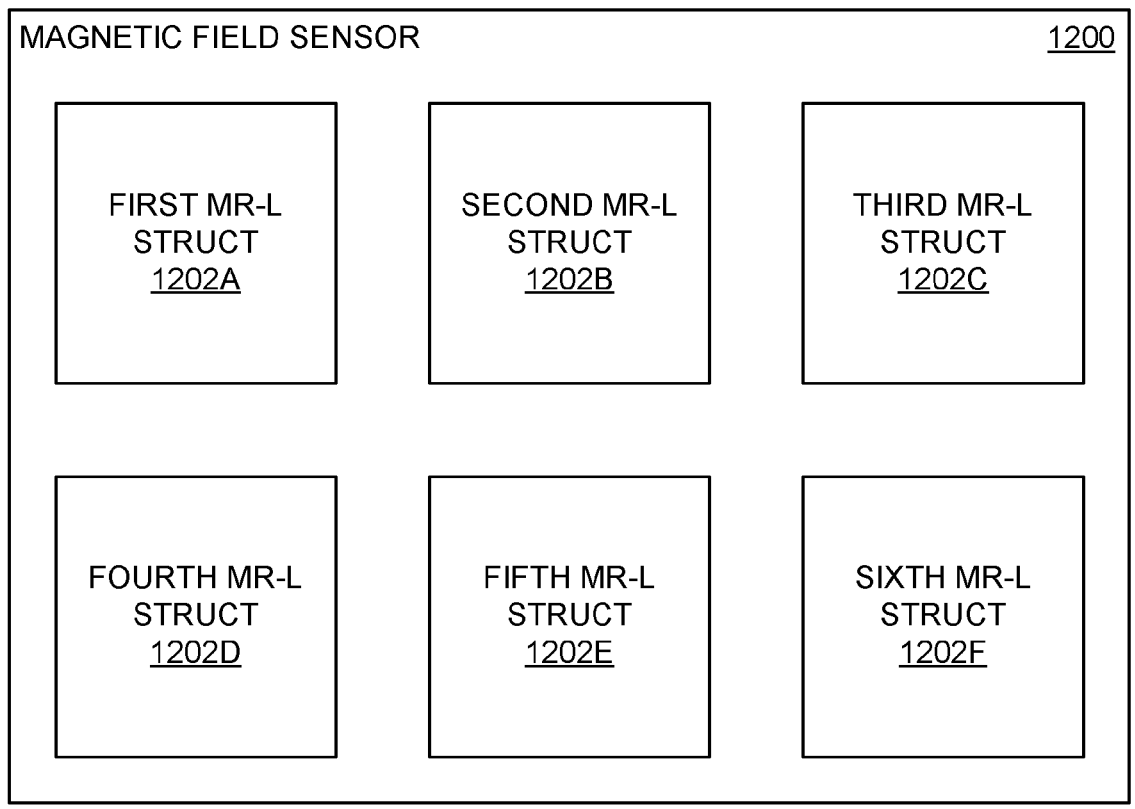
FIG. 12 is a block diagram of a magnetic field sensor, according to an embodiment of the invention.

FIG. 12 shows a magnetic field sensor 1200, according to another embodiment of the invention. The magnetic field sensor includes a first magneto resitive-layered structure 1202A, a second magnetoresistive-layered structured 1202B, a third magnetoresitive-layered structure 1202C, a fourth magnetoresitive-layered structured 1202D, a fifth magnetoresistive-layered structure 1202E, and a sixth magnetoresistive-layered structure 1202F, collectively referred to as the magnetoresistive-layered structures 1202. The magnetoresistive-layered structures 1202 may function as has been recited in the summary section above.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. Therefore, it is manifestly intended that this invention be limited only by the claims and equivalents thereof.

What is claimed is:

1. A magnetic field sensor for measuring an external magnetic field, comprising:
    a mechanism to generate a first offset magnetic field; and,
    a first magnetoresistive-layered structure having an electrical resistance depending on a magnitude of a first magnetic field, the first magnetic field comprising components of the external magnetic field and components of the first offset magnetic field,
    wherein the mechanism comprises a soft magnetic element arranged near the first magnetoresistive-layered structure, the soft magnetic element adapted to enhance a magnetic field induced by an electric current flowing through the first magnetoresistive-layered structure, and further adapted to be saturated by the magnetic field.

2. The magnetic field sensor of claim 1, wherein the mechanism comprises:
    a first sub-mechanism to generate a first modifiable component of the first offset magnetic field and having a first direction; and,
    a second sub-mechanism to generate a second modifiable component of the first offset magnetic field and having a second direction.

3. The magnetic field sensor of claim 1, wherein the mechanism comprises at least one of a permanent magnetic element, a ferromagnetic element, an inductive element, and an electrically conductive element.

4. The magnetic field sensor of claim 1, further comprising a second magnetoresistive-layered structure, the first and the second magnetoresistive layered structures arranged in a first bridge circuit and exhibiting a magnetoresistive effect.

5. The magnetic field sensor of claim 4, wherein the first offset magnetic field has a substantially equal effect on both the first and the second magnetoresistive-layered structures.

6. The magnetic field sensor of claim 4, wherein the mechanism is to further generate a second offset magnetic field, and wherein the first offset magnetic field has a first effect on the first magnetoresistive-layered structure and the second offset magnetic field has a second effect on the second magnetoresistive-layered structure different than the first effect.

7. The magnetic field sensor of claim 4, further comprising a third magnetoresistive-layered structure and a fourth magnetoresistive-layered structure, the first, the second, the third, and the fourth magnetoresistive-layered structures arranged in the first bridge structure, and the third and the fourth magnetoresistive-layered structures comprising a soft magnetic element adapted to screen at least one of the external magnetic field and the first offset magnetic field.

8. The magnetic field sensor of claim 7, further comprising a first soft magnetic planar structure and a second soft magnetic planar structure separated from one another by a first elongated gap, the first magnetoresistive-layered structure positioned along the first elongated gap.

9. The magnetic field sensor of claim 8, further comprising a fifth magnetoresistive-layered structure and a sixth magnetoresistive-layered structure, and a third soft magnetic planar structure and a fourth soft magnetic planar structured separated from one another by a second elongated gap, a direction of the second elongated gap substantially perpendicular to a direction of the first elongated gap, the fifth and the sixth magnetoresistive-layered structures positioned along the second elongated gap and arranged in a second bridge circuit.

10. The magnetic field sensor of claim 1, wherein a magnitude of the first offset magnetic field is substantially larger than a magnitude of the external magnetic field.

* * * * *